(12) United States Patent
Ghosh et al.

(10) Patent No.: US 10,296,673 B1
(45) Date of Patent: May 21, 2019

(54) MIXED-LANGUAGE SIMULATION

(71) Applicant: Xilinx, Inc., San Jose, CA (US)

(72) Inventors: Ishita Ghosh, Kolkata (IN); Hem C. Neema, Sunnyvale, CA (US); Jason Villarreal, Los Gatos, CA (US); Saikat Bandyopadhyay, Kolkata (IN); Kumar Deepak, San Jose, CA (US)

(73) Assignee: XILINX, INC., San Jose, CA (US)

( * ) Notice: Subject to any disclaimer, the term of this patent is extended or adjusted under 35 U.S.C. 154(b) by 390 days.

(21) Appl. No.: 14/723,188

(22) Filed: May 27, 2015

(51) Int. Cl.
  *G06F 17/50* (2006.01)
(52) U.S. Cl.
  CPC ...... *G06F 17/5009* (2013.01); *G06F 17/5081* (2013.01)
(58) Field of Classification Search
  USPC ........................................................ 716/106
  See application file for complete search history.

(56) References Cited

U.S. PATENT DOCUMENTS 7,035,781 B1 * 4/2006 Flake .................. G06F 17/5022
  703/1

* cited by examiner

*Primary Examiner* — Eric D Lee
(74) *Attorney, Agent, or Firm* — LeRoy D. Maunu; Kevin T. Cuenot

(57) ABSTRACT

For generating code for simulation of a circuit design, a hardware description language (HDL) description and a high-level language (HLL) description of portions of the circuit design are input. The HLL description specifies a first function and the HDL description includes a call to the first function. A wrapper is generated for the first function. The wrapper has an associated stack frame and includes code that stores in the stack frame values of arguments specified by the call to the first function and code that calls the first function. An HLL simulation specification is generated from the HDL description. The HLL simulation specification includes a call to the first HLL wrapper in place of the call to the first function. The HLL simulation specification, the first HLL wrapper, and the HLL description are compiled into executable program code.

16 Claims, 7 Drawing Sheets

MIXED-LANGUAGE SIMULATION

TECHNICAL FIELD

One or more embodiments generally relate to the simulation of circuit designs.

BACKGROUND

Due to advancements in processing technology, complex integrated circuits (ICs) can be designed using various levels of abstraction. Using a hardware description language (HDL), circuits can be designed at the gate level, the register transfer level (RTL), and higher logical levels. When designing using an HDL, the design is often structured in a modular manner. The designer describes a module in terms of the behavior of a system, the behavior describing the generation and propagation of signals through combinatorial modules from one set of registers to another set of registers. HDLs provide a rich set of constructs to describe the functionality of a module. Modules may be combined and augmented to form even higher level modules.

To reduce design costs, designers often incorporate previously created designs that have been provided either from within an enterprise or from a commercial provider. Libraries of pre-developed blocks of logic have been developed that can be selected and included in a circuit design. Such library modules include, for example, adders, multipliers, filters, and other arithmetic and digital signal processing (DSP) functions from which system designs can be readily constructed. The engineering community sometimes refers to these previously created designs as "IP cores" (intellectual property cores), or "logic cores," and such terms may be used interchangeably herein. The use of pre-developed logic cores permits faster design cycles by eliminating the redesign of circuits. Thus, using cores from a library may reduce design costs.

Some circuit designs may have parts specified in an HDL and other parts specified in a high-level language (HLL), such as C or C++, for example. Through a direct programming interface (DPI), modules in the HDL portion may invoke functions in the HLL portions, and functions in the HLL portion may invoke modules in the HDL portion. HLLs are different from HDLs in that HLLs may be used for general purpose programming of a computer. That is, an HLL program may be compiled into code that is executable by a computer processor. In contrast, an HDL specification is a high-level description from which a circuit may be implemented.

Prior to implementation, a circuit design may be simulated to determine whether the design will function as required. Wasted manufacturing costs due to faulty design may thereby be avoided. For simulation to be effective, the simulation must reflect the functional intent of the circuit designer. However, if there are errors in the HDL and/or HLL portions of the circuit design, that are not caught by the compiler or at runtime, simulation results may be erroneous or misleading. Problems encountered during simulation may delay the development process and increase development costs.

SUMMARY

In a method of generating code for simulation of a circuit design, a hardware description language (HDL) description and a high-level language (HLL) description of portions of the circuit design are input. The HLL description specifies a first function and the HDL description includes a call to the first function. A computer processor generates a first HLL wrapper corresponding to the call to the first function. The first HLL wrapper has an associated stack frame, and the first HLL wrapper includes code that stores in the stack frame values of arguments specified by the call to the first function and code that calls the first function. An HLL simulation specification is generated from the HDL description, and the HLL simulation specification includes a call to the first HLL wrapper in place of the call to the first function. The HLL simulation specification, the first HLL wrapper, and the HLL description are compiled into executable program code, and the program code is stored in a computer readable device.

In another embodiment, a method of simulating a circuit design includes executing on a computer processor, program code that simulates a hardware description language (HDL) portion of the circuit design description and a high-level language (HLL) portion of the circuit design. The HLL portion specifies a first function. A first wrapper function is invoked during execution of the program code that simulates the HDL portion. The first wrapper function corresponds to the first function in the HLL portion. The first wrapper function stores values of arguments of the first wrapper function in a first stack frame that is associated with invocation of the first wrapper function. The first function is invoked by the first wrapper function, and the first wrapper function stores in the first stack frame, values of one or more arguments returned by the first function. Control is returned from the first wrapper function to the program code that simulates the HDL portion.

A system for generating code for simulation of a circuit design is provided in another embodiment. The system includes a computer processor and a memory arrangement coupled to the computer processor. The memory arrangement is configured with program instructions that when executed by the computer processor, cause the computer processor to input a hardware description language (HDL) description and a high-level language (HLL) description of portions of the circuit design. The HLL description specifies a first function and the HDL description includes a call to the first function. A first HLL wrapper corresponding to the call to the first function is generated, and the first HLL wrapper has an associated stack frame. The first HLL wrapper includes code that stores in the stack frame values of arguments specified by the call to the first function and code that calls the first function. An HLL simulation specification is generated from the HDL description, and the HLL simulation specification includes a call to the first HLL wrapper in place of the call to the first function. The HLL simulation specification, the first HLL wrapper, and the HLL description are compiled into executable program code, and the program code is stored in a computer readable device.

It will be appreciated that various other embodiments are set forth in the Detailed Description and Claims, which follow.

BRIEF DESCRIPTION OF THE DRAWINGS

Various aspects and advantages will become apparent upon review of the following detailed description and upon reference to the drawings in which.

DETAILED DESCRIPTION

Figure 1:
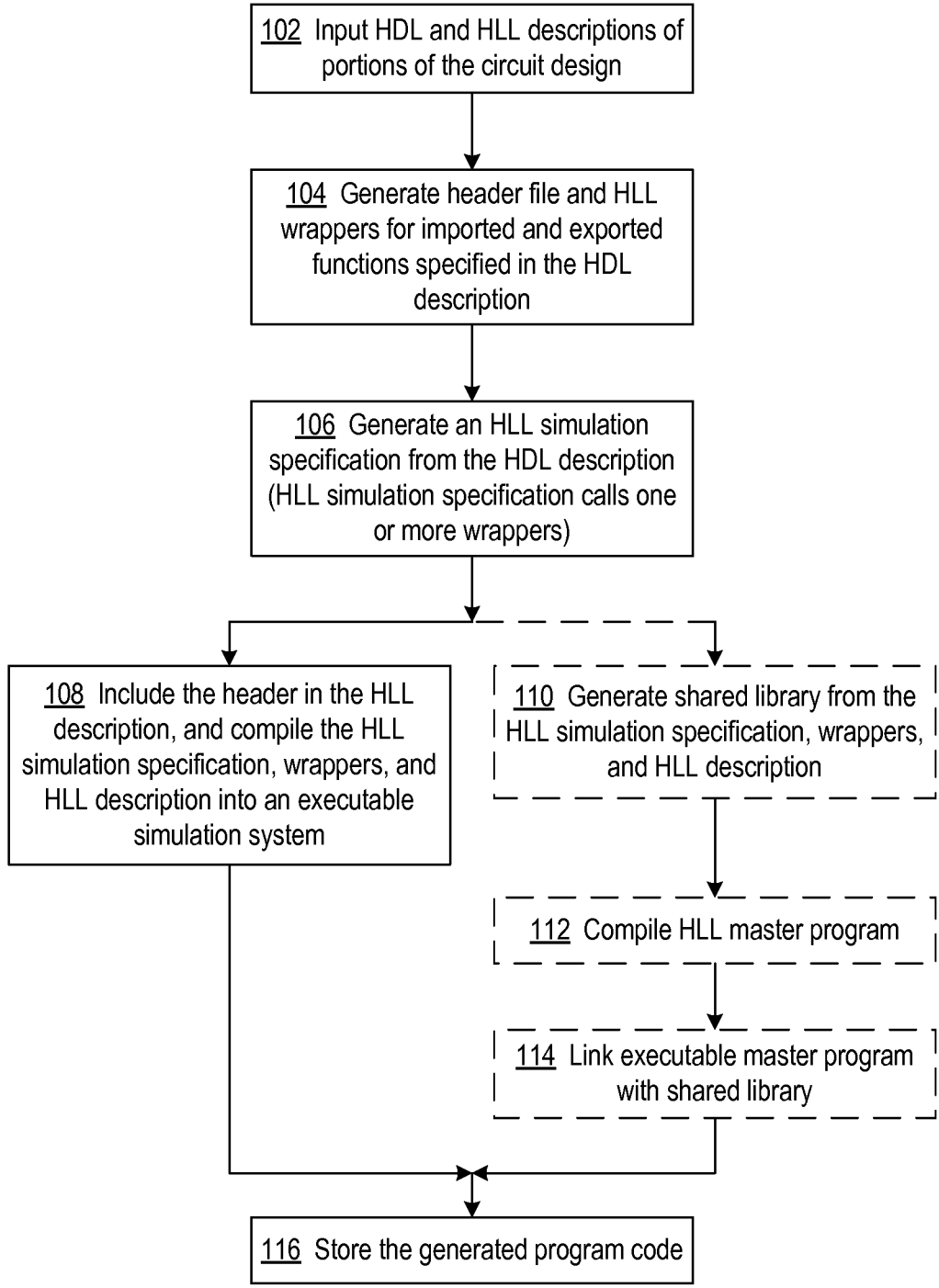
FIG. 1 is a flowchart of a process for generating executable code that simulates a circuit design.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed methods and systems provide compilation checking of HDL and HLL code and runtime checking of the executable program code generated from the HDL and HLL code in order to prevent erroneous simulation results. The methods and systems also enable simulation of heterogeneous system designs with structural components specified in an HDL and functional components specified in an HLL. The HLL simulation model can be invoked from the HDL simulation model. This opens up a vast scope of multi-language design paradigms. For example, a C-language-based simulation model that is initiated by the HDL-based model can in turn call Python or Swig utilities, as well as other foreign languages. The methods and systems also enable an HLL master program to control the HDL-based simulation model, which in turn interfaces with HLL-based functions in other portions of the circuit design.

The methods and systems are applicable to a hardware description language (HDL) description and a high-level language (HLL) description of portions of the circuit design. The HLL description specifies a function and the HDL description includes a call to that function, which may also be referred to as an "imported function." For each call to an imported function, a respective HLL wrapper is generated. Each wrapper has an associated stack frame in a call stack. The wrapper includes program code that stores in the stack frame values of arguments specified by the call to the imported function and code that calls the imported function. An HLL simulation specification is generated from the HDL description. The HLL simulation specification includes a call to the associated HLL wrapper in place of the call to the imported function. The wrapper is automatically generated during the compilation process and provides data conversion and scope analysis without any user-guided translation in either the HDL portion or the HLL portion of the circuit design. The HLL simulation specification, the HLL wrapper (s), and the HLL description are compiled into executable program code.

By having wrappers handle interface functions for calls between the HDL portion and HLL portion of a circuit design, the simulator engine and HLL run-time environment are not impacted by the cross-language calls. The wrappers provide a seamless flow of control and efficient data interchange across language boundaries, with performance comparable to an HDL method call. In addition, the wrappers check for out-of-scope function calls.

FIG. 1 is a flowchart of a process for generating executable code that simulates a circuit design. A portion of the circuit design is specified in an HDL and another portion of the circuit design is specified in an HLL, and the HDL portion includes a call to a function specified in the HLL portion. The called HLL function is an imported function. The HDL description may further include a function that is called from within the HLL description. The called HDL function may be referred to as an "exported function." The HDL description and the HLL description are input to a computer processor at block 102, and at block 104, the computer processor generates a header file and HLL wrappers for exported and imported functions specified in the HDL description. The wrappers may be generated in response to import and export statements that specify the imported and exported functions in the HDL code. The header file further includes declarations of arguments passed between the HDL and HLL portions.

At runtime when a wrapper is called from the HDL portion, an associated stack frame will be associated with the wrapper. The wrapper includes code that stores in the stack frame values of arguments specified by the call to the first function and code that calls the first function in the HLL portion.

Each wrapper further includes code that converts arguments and return values between the HDL and HLL portions and code that determines whether or not HLL-to-HDL function calls are within scope. The wrapper for an imported function converts the values of the arguments from an HDL format to an HLL format and stores the HLL format values in the stack frame associated with the wrapper call. The wrapper for an exported function converts the values of the arguments from an HLL format to an HDL format and stores the HDL format values in the stack frame associated with the wrapper call.

Each wrapper further includes code that determines whether or not HLL-to-HDL function calls are within scope. For an HDL function to be within the scope of a call to the HDL function by an HLL function, the HDL function must be exported from within the scope of the HDL function that most recently called an HLL function. The HLL function that calls the HDL function might not be the same HLL function that was initially called from the HDL function; the calling HLL function could be any HLL function in that execution call stack. The HDL function that initially called the HLL function might have exported functions visible within its scope but not necessarily at the same function level (as in nested scopes). For scope analysis, the wrapper generated for a call to an imported function includes code that stores scope information (identifiers of exported functions) in the stack frame associated with the wrapper. The wrapper generated for a call to an exported function includes code that reads scope information from the top stack frame and determines whether or not the called HDL function is identified in the scope information.

At block 106, an HLL simulation specification is generated from the HDL description. The HLL simulation specification includes a call to the HLL wrapper(s) in place of the call(s) to the HLL function(s).

The process paths that lead to blocks 108 and 110 are alternative flows. At block 108, the HDL portion of the circuit design is a master controller for simulation, and in the path that follows block 110, an HLL program, which is not part of the circuit design, is a master controller of the HDL portion. At block 108, the generated header is included in the HLL description, and the HLL simulation specification (as previously generated from the HDL portion), wrappers, and HLL description are compiled into an executable simulation system. By automatically specifying the argument declarations in the header file based on the declarations of the imported and exported functions in the HDL portion and then including the header file in the HLL portions, the compiler can flag for the user any illegal use of or reference to the arguments within the HLL portion. For example, the compiler can flag out-of-bounds references to arrays.

The executable program code is stored in a computer readable device at block 116.

Blocks 110, 112, and 114 generate executable program code in which an HLL program is a master controller of the HDL portion of the circuit design. The dashed line and blocks signify an alternative to the flow that follows block 108. At block 110, a shared library of executable code is generated from the HLL simulation specification, the wrappers, and the HLL description. The HLL master program is compiled into executable code at block 112, and at block 114, the executable master program is linked with the shared library, which was generated at block 110.

Figure 2:
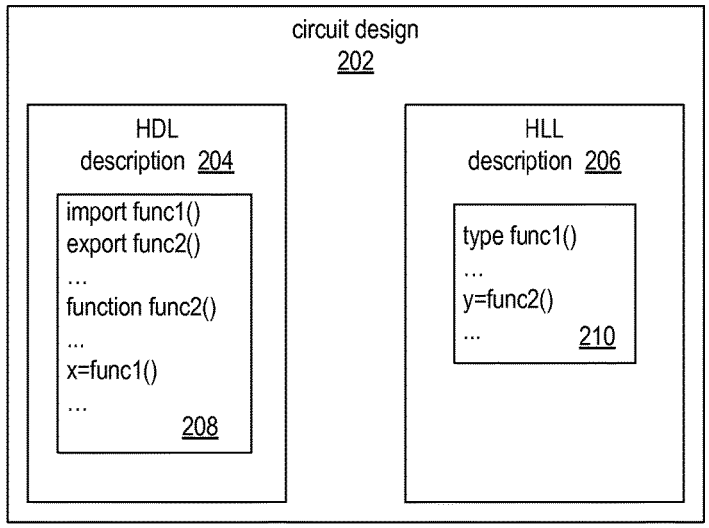
FIG. 2 shows an example of a circuit design that includes an HDL description of a portion of the circuit design and an HLL description of a portion of the circuit design.

FIG. 2 shows an example of a circuit design 202 that includes an HDL description 204 of a portion of the circuit design and an HLL description 206 of a portion of the circuit design. The HDL description includes a module 208 that defines an HDL function func2( ), and the module calls function func1( ) 210 in the HLL description. The module imports function func1( ), as function func1( ) is a function specified in the HLL description. The HDL module also specifies a function func2( ), which is exported. The HLL description includes a specification of function func1( ), and function func1( ) calls the HDL function func2( ).

Figure 3:
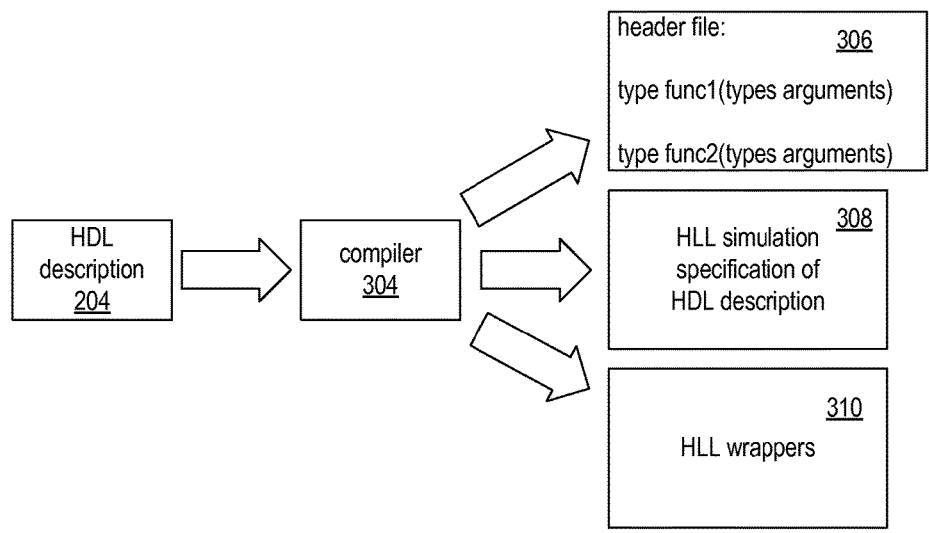
FIG. 3 shows compilation of an HDL portion of the circuit design, and the elements that are generated in the compilation.

FIG. 3 shows compilation of an HDL portion of the circuit design, and the elements that are generated in the compilation. The HDL description 204 is input to compiler 304, and from the HDL description, the compiler generates a header file 306, an HLL simulation specification 308, and one or more HLL wrappers 310.

The header file 306 declares the functions that the HDL file imports and exports, along with the arguments passed in the function calls. The declarations of the arguments may be helpful in detecting improper accesses to arguments such as arrays. For example, the dimensions of an array passed as an argument to the HLL function may be determined from the HDL description. By including declaration of the array in the header file and including the header file in the HLL description, references beyond the bounds of the array can be detected at compile and/or runtime. The compiler may signal a compilation error in response to inconsistency between specification of the function and the arguments in the HLL description and the declaration of the function and the arguments of the function in the header file. The runtime system may signal an error in response to access beyond the bounds of the array during execution of the program.

The HLL simulation specification 308 is an HLL specification of the HDL description that may be further compiled into executable code. The HLL simulation specification may include an HLL specification of a function exported by the HDL description 204. The HLL wrappers 310 provide the interface between the calls by the HDL to the HLL functions and the calls by the HLL to the HDL functions.

Figure 4:
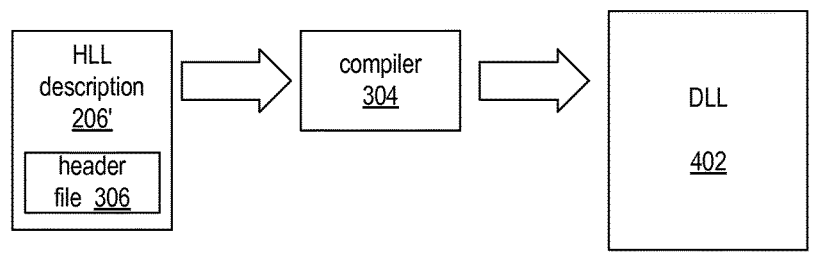
FIG. 4 shows compilation of the HLL portion of the circuit design.

FIG. 4 shows compilation of the HLL portion of the circuit design. The header file 306, which was generated in compilation of the HDL description, is added to the HLL description 206 (FIG. 2), resulting in HLL description 206'. A dynamic linked library (DLL) 402 is generated for linking with the executable code generated from the HDL description (FIG. 3, 204).

Figure 5:
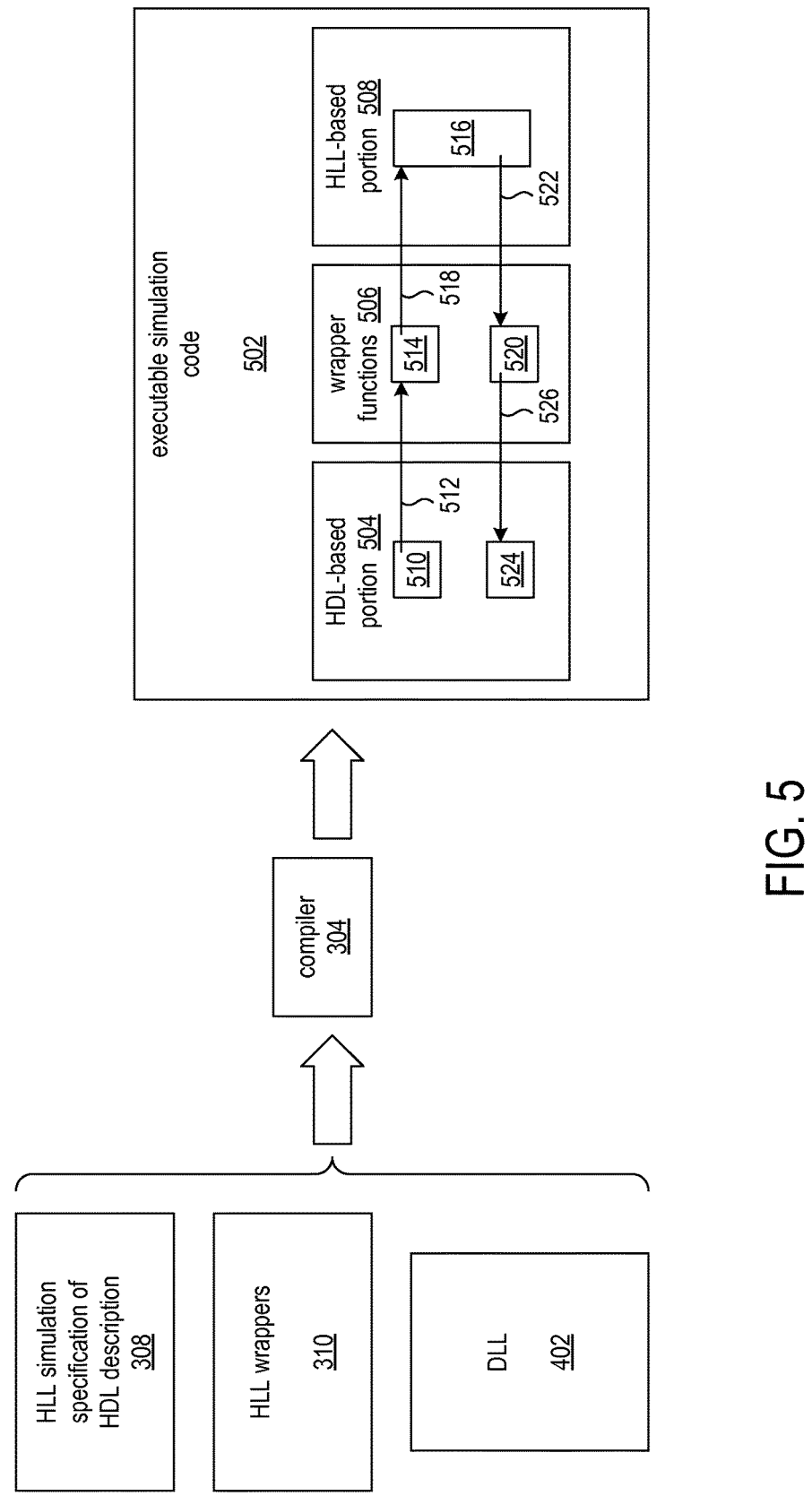
FIG. 5 shows compilation of the HLL simulation specification of the HDL portion of the circuit design, the generated HLL wrappers, and the dynamic linked library (DLL) of the HLL portion of the circuit design.

FIG. 5 shows compilation of the HLL simulation specification 308 of the HDL portion of the circuit design, the generated HLL wrappers 310, and the DLL 402 of the HLL portion of the circuit design. Executable simulation code 502 is generated from the compilation. The executable simulation code includes an HDL-based portion 504, wrapper functions 506, and HLL-based portion 508. The HDL-based portion 504 is executable program code generated from the HLL simulation specification 308, the wrapper functions 506 includes executable program code generated from the HLL wrappers 310, and the HLL-based portion 508 includes executable program code generated from the DLL 402.

Block 510 is an example of executable program code generated from a module of the HDL description 204 (FIG. 2), and line 512 represents a call to wrapper function 514 from code 510. Wrapper function 514 in turn calls program code 516, which represents an imported function from the HLL description 206 (FIG. 2). Line 518 represents the function call by the wrapper function 514 to the function in the program code 516. After some processing, the function in program code 516 may call wrapper function 520, as represented by line 522. Wrapper function 520 in turn calls program code 524, which represents an exported function from the HDL description 204. Line 526 represents the function call by the wrapper function 520 to the function in the program code 504.

Figure 6:
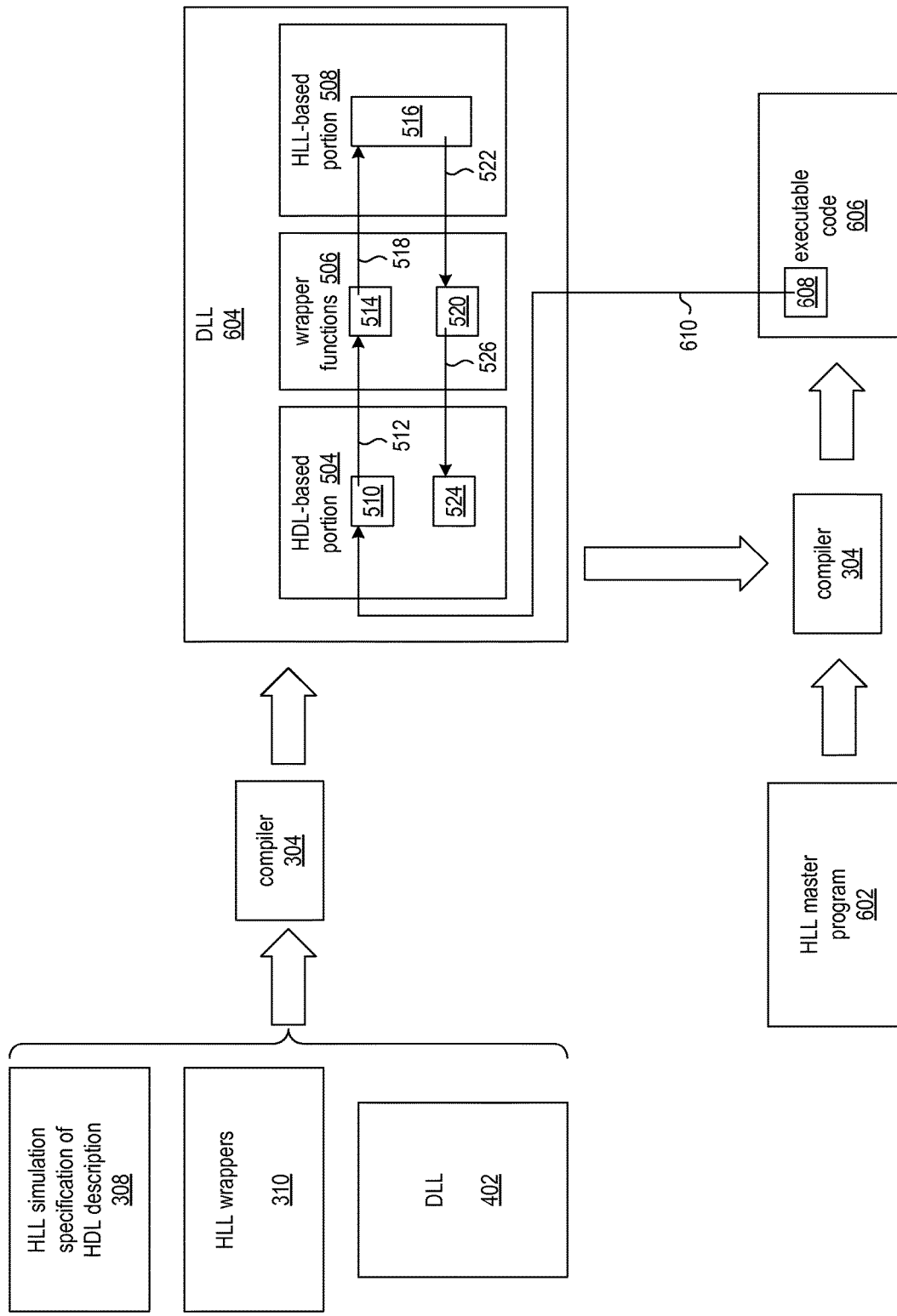
FIG. 6 shows compilation of an HLL master program, along with the HLL simulation specification of the HDL portion of the circuit design, the generated HLL wrappers, and the DLL of the HLL portion of the circuit design.

FIG. 6 shows compilation of an HLL master program 602, along with the HLL simulation specification 308 of the HDL portion of the circuit design, the generated HLL wrappers 310, and the DLL 402 of the HLL portion of the circuit design. Controlling the simulation from an HLL master program allows a user-constructed program to get values from and put values on top-level ports of the circuit design and allows programmable user control over the simulation flow.

The HLL simulation specification 308, the HLL wrappers 310, and the DLL 402 of the HLL portion of the circuit design are compiled into a DLL 604. The HLL master program 602 is compiled into executable code 606 (executable master control program), and the DLL 604 is linked with the executable code 606. The executable code 606 includes program code 608 that initiates a module of the HDL portion by way of a call to a function in the program code 510 in the HDL-based portion 504. The call by the executable code 606 of the master program to the HDL-based function is represented by line 610.

Figure 7:
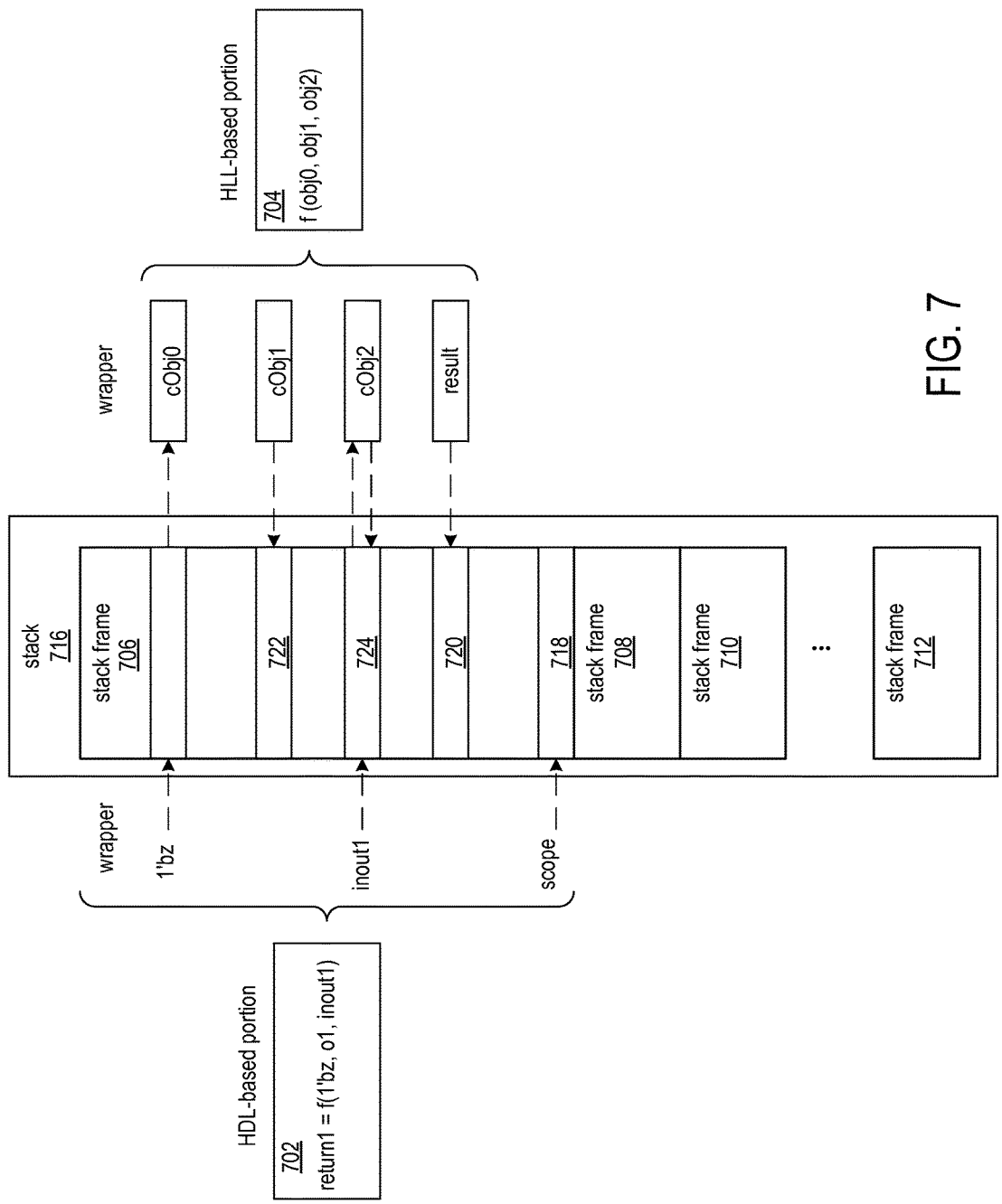
FIG. 7 shows a data flow between an HDL-based portion of executable simulation code and an HLL-based portion of executable simulation code.

FIG. 7 shows a data flow between an HDL-based portion 702 of executable simulation code and an HLL-based portion 704 of executable simulation code. The HDL portion includes call to function f, which in the HDL-based portion

702 is a call to a wrapper associated with the call to function f. The function call has three arguments: an input bit value z, an output argument o1, and an input-output argument inout1.

The HDL-based portion 702 calls the wrapper, which provides the interface to executable function f. The call to the wrapper has an associated stack frame 706, and the input bit value z and the value of the argument inout1 are converted to a format compatible with the HLL-based portion 704 and stored in the stack frame. Stack frame 706 is the top-most stack frame of stack frames 708, 710, and 712 in stack 716.

The wrapper also stores scope information 718 in the stack frame 706. The scope information includes identifiers of functions exported by the module of the HDL from which the function f was invoked.

The wrapper invokes the executable function f in the HLL-based portion 704, passing the HLL-formatted value of input argument bit z, identified as cObj0, and the HLL-formatted value of inout1, identified as cObj2, from the stack frame 706.

The HDL-based portion 704 returns control to the wrapper, and the wrapper obtains a result and values of the output arguments. The wrapper converts the return value from HLL format to a format suitable for the HDL-based portion 702 and stores the converted value 720 in the stack frame 706. Similarly, the wrapper converts values of the output arguments of the function f from HLL format to a format compatible with the HDL-based portion. The converted values 722 and 724 are stored in stack frame 706.

Figure 8:
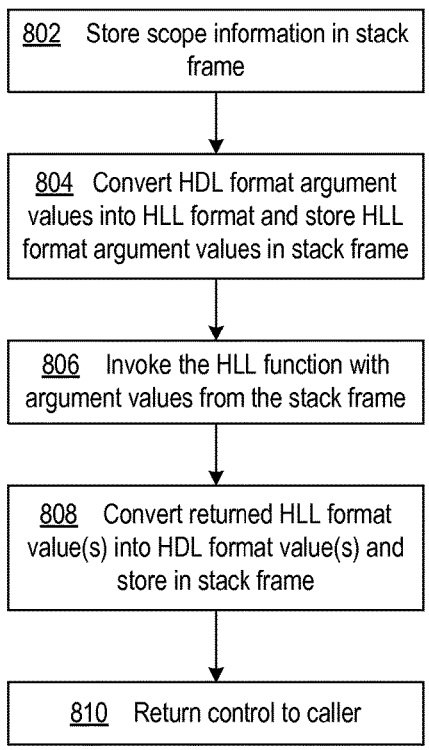
FIG. 8 is a flowchart of a process performed by a wrapper for a call to an imported function.

FIG. 8 is a flowchart of a process performed by a wrapper for a call to an imported function. When the wrapper is called, at block 802, the wrapper stores scope information in the top frame of the stack. The scope information includes identifiers of functions exported by the HDL module from which the program code calling the wrapper was generated. Example 1 below shows HDL code and HLL code from which scope information may be generated and stored.

module TOP ( );
      function int svFunc(input int x);
        return 3;
      endfunction
      import "DPI-C" context function int cFunc(input int x);
      export "DPI-C" function svFunc;
      int result;
      initial result=cFunc(5); //This call can access svFunc
    endmodule
    #include "dpi.h"
      //C code has no idea who called it
      int cFunc(int x)
      {
        return x+svFunc(x);
      }

Example 1

The HDL module TOP imports the HLL function cFunc and exports the HDL function svFunc. The wrapper that is associated with the call to cFunc stores a function identifier of svFunc on the stack frame of the wrapper. The wrapper that is associated with the call to svFunc by the HLL function cFunc, checks the scope information in the stack frame to determine whether or not the call to svFunc is within scope. The call to svFunc would be found to be within scope, because svFunc is identified in the scope information.

At block 804, the values of input arguments to the called imported function are converted from HDL format to HLL format, and the converted values are stored in the stack frame associated with the call to the wrapper. At block 806, the imported HLL-based function is invoked by the wrapper, and the converted values from the stack frame are passed as arguments to the HLL-based function.

Upon return of control from the HLL-based function to the wrapper, at block 808 the wrapper converts values of output arguments and the return value from the HLL-based function to HDL format and stores the converted values in the stack frame. At block 810, control is returned to the calling HDL-based function.

Figure 9:
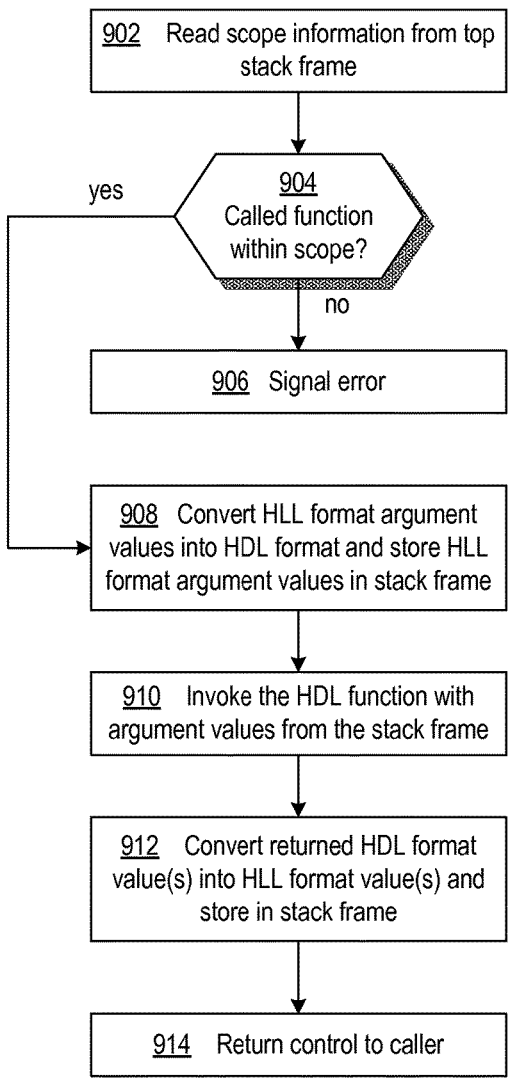
FIG. 9 is a flowchart of a process performed by a wrapper for a call from HLL-based program code to an exported function in HDL-based program code.

FIG. 9 is a flowchart of a process performed by a wrapper for a call from HLL-based program code to an exported function in HDL-based program code. When the wrapper is called, at block 902 the wrapper reads scope information from the top frame of the stack. Decision block 904 determines whether or not the called function is within scope. For the called function to be within scope, the identifier of the called function must match a function identifier in the scope information that was read from the stack frame. If the called function is not within scope, an error may be signaled to the user and the simulation may be halted. In the code of Example 1, if the function svFunc was not identified as an exported function in the HDL module TOP, and the HLL function cFunc called, svFunc as shown in the code, then the call to svFunc would be out of scope and flagged as an error as shown by block 906.

If the called function is within scope, at block 908 the process converts the values of HLL-format arguments to HDL-format and stores the converted values in the stack frame. The HDL-based function is invoked by the wrapper at block 910, passing the values of the arguments from the stack to the called function.

Upon return of control from the HDL-based function to the wrapper, at block 912 the wrapper converts values of output arguments and the return value from the HDL-based function to HLL format and stores the converted values in the stack frame. At block 914, control is returned to the calling HLL-based function.

Figure 10:
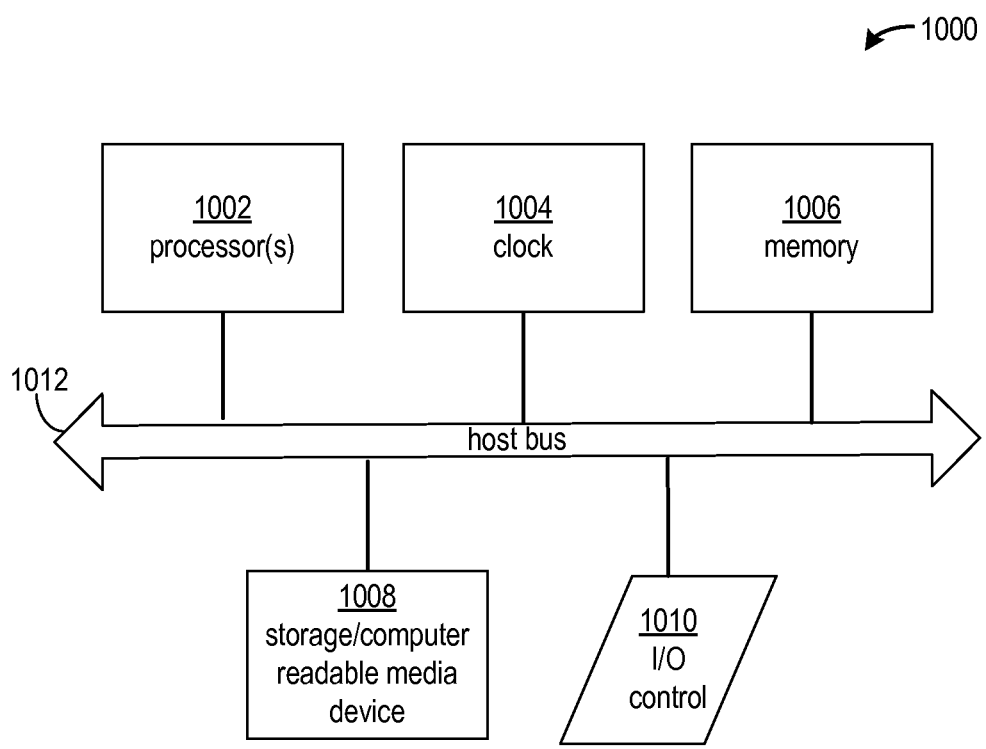
FIG. 10 shows a block diagram of an example computing arrangement that may be configured to implement the data structures and processes described herein.

FIG. 10 shows a block diagram of an example computing arrangement that may be configured to implement the data structures and processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 1000 includes one or more processors 1002, a clock signal generator 1004, a memory arrangement 1006, a storage arrangement 1008, and an input/output control unit 1010, all coupled to a host bus 1012. The arrangement 1000 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 1002 may be one or more general purpose processors, or a combination of one or more general purpose processors and suitable co-processors, or one or more specialized processors (e.g., RISC, CISC, pipelined, etc.).

The memory arrangement 1006 typically includes multiple levels of cache memory, and a main memory. The storage arrangement 1008 may include local and/or remote persistent storage, such as provided by magnetic disks (not shown), flash, EPROM, or other non-volatile data storage. The storage unit may be read or read/write capable. Further, the memory arrangement 1006 and storage arrangement 1008 may be combined in a single arrangement.

The processor(s) 1002 executes the software in storage arrangement 1008 and/or memory arrangement 1006, reads data from and stores data to the storage arrangement 1008 and/or memory arrangement 1006, and communicates with external devices through the input/output control arrangement 1010. These functions are synchronized by the clock signal generator 1004. The resource of the computing arrangement may be managed by either an operating system (not shown), or a hardware control unit (not shown).

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for mixed language simulation. Other aspects and features will be apparent to those skilled in the art from consideration of the specification. It is intended that the specification and drawings be considered as examples only, with a true scope of the invention being indicated by the following claims.

What is claimed is:

1. A method of generating code for simulation of a circuit design, comprising:
   inputting a hardware description language (HDL) description and a high-level language (HLL) description of portions of the circuit design, wherein the HLL description specifies a first function and the HDL description includes a call to the first function;
   generating by a computer processor a header file that specifies a declaration of the first function and the arguments of the first function, wherein the declaration of the arguments includes dimension of an array based on the HDL description;
   generating by the computer processor, a first HLL wrapper corresponding to the call to the first function, wherein the first HLL wrapper has an associated stack frame, and the first HLL wrapper includes code that stores in the stack frame values of arguments specified by the call to the first function and code that calls the first function;
   generating an HLL simulation specification from the HDL description, wherein the HLL simulation specification includes a call to the first HLL wrapper in place of the call to the first function;
   compiling by the computer processor the HLL simulation specification, the first HLL wrapper, and the HLL description into executable program code;
   wherein the compiling the HLL description includes signaling a compilation error in response to inconsistency between specification of the first function, the arguments and the dimension of the array in the HLL description and the declaration of the first function, the arguments and the dimensions of the array of the first function in the header file;
   wherein the signaling the compilation error prevents erroneous simulation results; and
   storing the executable program code in a computer readable device.

2. The method of claim 1, further comprising:
   wherein the HDL description specifies a second function, and the HLL description specifies a call to the second function, and the generating the HLL simulation specification includes generating an HLL specification of the second function;
   generating a second HLL wrapper corresponding to the call to the second function, wherein the second HLL wrapper has an associated stack frame, and the second HLL wrapper includes code that stores in the stack frame values of arguments specified by the call to the second function and code that calls the HLL specification of the second function.

3. The method of claim 2, wherein:
   the generating of the first HLL wrapper includes generating program code that stores scope information in the stack frame when the call to the first function is performed; and
   the generating of the second HLL wrapper includes generating program code that reads the scope information from a top stack frame when the call to the second function is performed, and determines whether or not the call to the second function is within a scope specified by the scope information read from the top stack frame.

4. The method of claim 2, wherein:
   the HDL description includes an export statement that specifies the second function;
   the generating of the first HLL wrapper includes, in response to the export statement, generating program code that stores scope information including an identifier of the second function in the stack frame when the call to the first function is performed; and
   the generating of the second HLL wrapper includes generating program code that, when the call to the second function is performed:
     reads scope information from a top stack frame;
     invokes the second function in response to the second function being identified by the scope information read from the top stack frame; and
     signals an error in response to the second function not being identified by the scope information read from the top stack frame.

5. The method of claim 1, wherein the generating of the first HLL wrapper includes generating program code that converts the values of the arguments from an HDL format to an HLL format.

6. The method of claim 5, wherein the code that stores the values of the arguments in the stack frame stores the HLL format values of the arguments in the stack frame.

7. The method of claim 1, further comprising:
   wherein the HDL description specifies a second function, and the HLL description specifies a call to the second function, and the generating the HLL simulation specification includes generating an HLL specification of the second function; and
   generating a second HLL wrapper corresponding to the call to the second function, wherein the second HLL wrapper has an associated stack frame, and the second HLL wrapper includes code that converts values of arguments specified by the call to the second function from an HLL format to an HDL format, stores in the stack frame the HDL format of the values of arguments, and calls the HLL simulation specification of the second function.

8. The method of claim 7, wherein the generating the second HLL wrapper includes generating program code that converts a return value from the second function from the HDL format to an HLL format.

9. The method of claim 1, wherein the compiling the HLL simulation specification, the first HLL wrapper, and the HLL description into executable program code includes generating a shared library of executable program code, and the method further comprising:
- compiling an HLL description of a master control program into an executable master control program, wherein the HLL description of master control program specifies initiation of a module in the HDL description of the portion of the circuit design;
- linking the shared library of executable program code with the executable master control program; and
- storing the executable master control program in the computer readable device.

10. A method of simulating a circuit design, comprising:
executing on a computer processor, program code that simulates a hardware description language (HDL) portion of the circuit design and a high-level language (HLL) portion of the circuit design, wherein the HDL portion imports a first function of the HLL portion and exports a second function;
invoking a first wrapper function during execution of the program code that simulates the HDL portion, wherein the first wrapper function corresponds to the first function in the HLL portion;
storing by the first wrapper function, values of arguments of the first wrapper function in a first stack frame associated with invocation of the first wrapper function;
storing by the first wrapper function, scope information in the first stack frame, the scope information including an identifier of each HDL function exported by a function of the HDL portion that invoked the first wrapper function;
invoking the first function by the first wrapper function by the computer processor;
storing by the first wrapper function in the first stack frame, values of one or more arguments returned by the first function; and
returning control from the first wrapper function to the program code that simulates the HDL portion;
invoking a second wrapper function during execution of the program code that simulates the HLL portion, wherein the second wrapper function corresponds to the second function exported in the HDL portion;
responsive to comparing the second function with the scope information by matching the second function to one of the identifiers of the HDL functions exported by the function of the HDL portion that invoked the first wrapper function, invoking, by the computer processor, the second function;
storing by the second wrapper function, values of arguments of the second wrapper function in a second stack frame associated with invocation of the second wrapper function;
storing by the second wrapper function in the second stack frame, values of one or more arguments returned by the second function; and
returning control from the second wrapper function to the program code that simulates the HLL portion.

11. The method of claim 10, further comprising converting the values of the arguments of the first wrapper function from an HDL format to an HLL format, and wherein the values of arguments of the first wrapper function stored in the first stack frame are the converted values.

12. The method of claim 10, further comprising:
wherein the HDL portion specifies the second function;
invoking the second wrapper function during execution of the program code that simulates the HLL portion, wherein the second wrapper function corresponds to the second function in the HDL portion;
converting values of arguments of the second wrapper function from an HLL format to an HDL format;
wherein the storing by the second wrapper function, the values of the arguments in the second stack frame associated with invocation of the second wrapper function are stored in the HDL format; and
invoking the second function by the second wrapper function.

13. The method of claim 12, further comprising:
converting a return value from the second function from the HDL format to the HLL format; and
returning control from the second wrapper function to the program code that simulates the HLL portion.

14. A system for generating code for simulation of a circuit design, comprising:
a computer processor;
a memory arrangement coupled to the computer processor, wherein the memory arrangement is configured with program instructions that when executed by the computer processor, cause the computer processor to perform operations including:
- inputting a hardware description language (HDL) description and a high-level language (HLL) description of portions of the circuit design, wherein the HLL description specifies a first function and the HDL description includes a call to the first function;
- generating by the computer processor a header file that specifies a declaration of the first function and the arguments of the first function, wherein the declaration of the arguments includes dimension of an array based on the HDL description;
- generating by the computer processor, a first HLL wrapper corresponding to the call to the first function, wherein the first HLL wrapper has an associated stack frame, and the first HLL wrapper includes code that stores in the stack frame values of arguments specified by the call to the first function and code that calls the first function;
- generating an HLL simulation specification from the HDL description, wherein the HLL simulation specification includes a call to the first HLL wrapper in place of the call to the first function;
- compiling by the computer processor the HLL simulation specification, the first HLL wrapper, and the HLL description into executable program code;
- wherein the compiling the HLL description includes signaling a compilation error in response to inconsistency between specification of the first function, the arguments and the dimension of the array in the HLL description and the declaration of the first function, the arguments and the dimensions of the array of the first function in the header file;
- wherein the signaling the compilation error prevents erroneous simulation results; and
- storing the executable program code in a computer readable device.

15. The system of claim 14, wherein:
the HDL description specifies a second function, and the HLL description specifies a call to the second function, and the instructions for generating the HLL simulation specification include instructions that generate an HLL specification of the second function; and
the memory arrangement is further configured with program instructions that when executed by the computer processor, cause the computer processor to generate a second HLL wrapper corresponding to the call to the second function, wherein the second HLL wrapper has an associated stack frame, and the second HLL wrapper includes code that stores in the stack frame values of arguments specified by the call to the second function and code that calls the HLL specification of the second function.

16. The system of claim 15, wherein:
the instructions for generating the first HLL wrapper include instructions that generate program code that stores scope information in the stack frame when the call to the first function is performed; and
the instructions for generating the second HLL wrapper include instructions that generate program code that reads the scope information from a top stack frame when the call to the second function is performed, and determines whether or not the call to the second function is within a scope specified by the scope information read from the top stack frame.

* * * * *